United States Patent
Shepard, Jr. et al.

(10) Patent No.: US 8,592,325 B2
(45) Date of Patent: Nov. 26, 2013

(54) INSULATING LAYERS ON DIFFERENT SEMICONDUCTOR MATERIALS

(75) Inventors: Joseph F. Shepard, Jr., Hopewell Junction, NY (US); Siddarth A. Krishnan, Hopewell Junction, NY (US); Rishikesh Krishnan, Hopewell Junction, NY (US); Michael P. Chudzik, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 107 days.

(21) Appl. No.: 12/685,332

(22) Filed: Jan. 11, 2010

(65) Prior Publication Data

US 2011/0169141 A1 Jul. 14, 2011

(51) Int. Cl.
*H01L 21/31* (2006.01)
*H01L 21/469* (2006.01)

(52) U.S. Cl.
USPC ............ 438/773; 257/640; 257/646; 438/770

(58) Field of Classification Search
USPC .......... 257/348, 411, 723, 640, 646; 438/239, 438/400, 435, 724, 758, 767, 773
See application file for complete search history.

(56) References Cited

U.S. PATENT DOCUMENTS

| | | | |
|---|---|---|---|
| 5,547,894 A | 8/1996 | Mandelman et al. | |
| 5,612,260 A | 3/1997 | Palmour | |
| 5,776,837 A | 7/1998 | Palmour | |
| 6,143,635 A | 11/2000 | Boyd et al. | |
| 6,475,842 B1 | 11/2002 | Cheah et al. | |
| 6,806,584 B2 | 10/2004 | Fung et al. | |
| 6,946,349 B1 | 9/2005 | Lee et al. | |
| 7,057,216 B2 | 6/2006 | Ouyang et al. | |
| 7,303,949 B2 | 12/2007 | Chen et al. | |
| 7,928,493 B2 * | 4/2011 | Cho et al. | ....... 257/314 |
| 2002/0145157 A1 | 10/2002 | Momose et al. | |
| 2006/0267061 A1 | 11/2006 | Howard | |
| 2006/0275710 A1 * | 12/2006 | Yamazaki et al. | ........... 430/313 |
| 2007/0052037 A1 | 3/2007 | Luan | |
| 2007/0178677 A1 | 8/2007 | Miller, Jr. et al. | |
| 2007/0181977 A1 * | 8/2007 | Lochtefeld et al. | ........... 257/618 |
| 2008/0073705 A1 | 3/2008 | Hisamoto et al. | |
| 2008/0224216 A1 * | 9/2008 | Cheng et al. | ................ 257/348 |
| 2008/0224234 A1 | 9/2008 | Sasaki | |
| 2009/0061631 A1 | 3/2009 | Lee et al. | |
| 2009/0166752 A1 | 7/2009 | Li | |
| 2009/0191722 A1 * | 7/2009 | Hasebe et al. | ................ 438/792 |

OTHER PUBLICATIONS

U.S. Official Action mailed Oct. 24, 2012 in related U.S. Appl. No. 13/431,537.
U.S. Office Action dated Jun. 12, 2013 issued in related patent application U.S. Appl. No. 13/431,537.

* cited by examiner

*Primary Examiner* — Kimberly Rizkallah
*Assistant Examiner* — Errol Fernandes
(74) *Attorney, Agent, or Firm* — Scully, Scott, Murphy & Presser, P.C.; Joseph P. Abate, Esq.

(57) ABSTRACT

A method of creating insulating layers on different semiconductor materials includes providing a substrate having disposed thereon a first material and a second material, the second material having a chemical composition different from the first material; non-epitaxially depositing a continuous sacrificial layer of approximately constant thickness onto the first material and the second material, and then converting the sacrificial layer into a layer consisting essentially of $SiO_2$ without oxidizing more than 10 angstroms into the second material. A structure includes a silicon nitride film disposed conformally on a silicon layer and a silicon germanium layer; a $SiO_2$ layer is disposed on the silicon nitride film.

17 Claims, 7 Drawing Sheets

INSULATING LAYERS ON DIFFERENT SEMICONDUCTOR MATERIALS

FIELD OF THE INVENTION

The present invention relates to methods of creating insulating layers for semiconductor device structures, and particularly for field effect transistor structures formed on a same substrate. The present invention relates also to semiconductor structures created during the methods.

BACKGROUND OF THE INVENTION

High performance logic device structures often include embedded SiGe channels in the pFETs while the nFETs are constructed on conventional single crystal substrates. To construct multiple gate oxides (so called double gate architectures) on embedded SiGe channels and on Si channels requires that the gate insulators/dielectrics be deposited, for example, by means of chemical vapor deposition (CVD). CVD techniques are used in order to construct devices with comparable physical thicknesses. If the double gate oxides are constructed by means of thermal oxidation (in a manner consistent with non-SiGe channel technologies), then the differing oxidation rates of the SiGe and Si will result in devices with different characteristics (Tinv, Vt, Ion/Ioff etc.). These different characteristics are often problematic.

In most cases, the CVD oxides deposited on SiGe channels are so called "high temperature oxides" or HTOs. HTOs can be deposited in either single wafer or batch furnace type tools. HTOs are typically produced through a reaction of SiH4 or Si2H6 with N2O, O2 or H2O at reduced pressures such as 200 Torr and temperatures between 600° C. and 800° C.

It is often reported that HTO layers are of lower quality when compared to $SiO_2$ films (layers) produced by means of thermal oxidation of single crystal substrates. The lower film quality is manifested in higher trap densities (in the bulk of the film and the interface) which often leads to reduced reliability metrics, e.g. Vbd, TDDB, NBTI, etc. This reduced reliability, therefore, generally precludes the use of HTOs in high performance CMOS transistor applications.

SUMMARY OF THE INVENTION

The present invention is directed to processes for (methods of) creating high quality $SiO_2$ films and interfaces in high performance CMOS technologies which use SiGe (or some other semiconducting material such as SiC, GaAs, etc.) which results in differing oxidation rates on the n-FET region and p-FET region and, thereby, precludes the use of conventional thermal oxidation to create the FET devices.

The inventive processes described through embodiments herein are based on the deposition of a thin layer of a sacrificial material, e.g., Si3N4. The thin layer is deposited in a continuous film ranging from a single monolayer to any desired thickness. In the embodiments, the continuous film of the sacrificial material preferably is conformal with the underlying materials. The sacrificial material is then oxidized to a thickness which consumes (preferably, completely) the sacrificial film but does not oxidize more than ten (10) angstroms into the underlying SiGe material. Because the gate dielectric is created by means of the thermal oxidation of the sacrificial material, the composition of the finished (oxidized in this case) material is not dictated by the transport of, the ratio of, or the purity of process gasses, but rather by: 1) the availability of Si in the starting material, and 2) the presence of a suitable oxidant.

The inventors believe films and interfaces created according to embodiments of the present invention will be of a higher quality than CVD deposited oxides (e.g., HTOs) and may be employed in integration arrangements requiring multiple gate oxides disposed on channels constructed of dissimilar materials.

According to a preferred embodiment of the present invention, a method of creating insulating layers on different semiconductor materials includes: providing a substrate having disposed thereon a first material and a second material, the second material having a chemical composition different from the first material; non-epitaxially depositing a continuous sacrificial layer of approximately constant thickness onto the first material and the second material; and then converting the sacrificial layer into a layer consisting essentially of $SiO_2$ without oxidizing more than ten (10) angstroms into the second material. More preferably, the sacrificial layer is converted entirely into $SiO_2$ without oxidizing any of the second material.

It is a principal object of the present invention to provide a method of creating oxides having at least approximately (±10%) equal or equal thicknesses on different semiconductor materials.

It is a further object of the present invention to provide such a method that is highly compatible with conventional methods/processes for producing nFETs and pFETs on a same substrate.

Further and still other objects of the present invention will become more readily apparent when the following description is taken in conjunction with the drawing figures.

DETAILED DESCRIPTION OF PREFERRED EMBODIMENTS AND BEST MODE

Turning now to FIGS. 1-4, and FIG. 7, there is shown a preferred embodiment of the steps according to the present invention.

Figure 1:
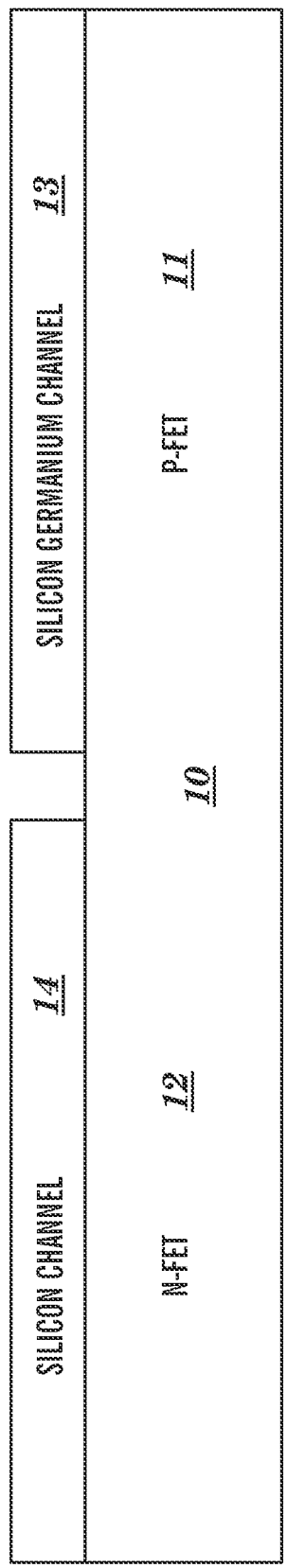
FIG. 1 is a cross-sectional block diagram showing step one of a preferred embodiment of the present invention.

FIG. 1 shows a starting condition or step for the preferred embodiment. There is provided a semiconductor (e.g., bulk silicon) substrate 10 having a first region such as a P-FET region 11 and a second region such as an N-FET region 12. A silicon germanium channel region 13 is formed at the P-FET region and a silicon channel region 14 is formed at the N-FET region. The regions 13, 14 are formed by conventional CMOS manufacturing process techniques. For example, region 14 is created by dry etching the starting substrate 10 to form the N-FET region. Region 13 is created via an epitaxial growth of a silicon germanium film with a desired Ge concentration (typically 20%). Of course, other suitable Ge concentrations may be used.

In the preferred embodiment, the chemical composition of the region 14, for example, includes or preferably consists essentially of Si, while the chemical composition of the region 13 includes or preferably consists essentially of SiGe.

Figure 2:
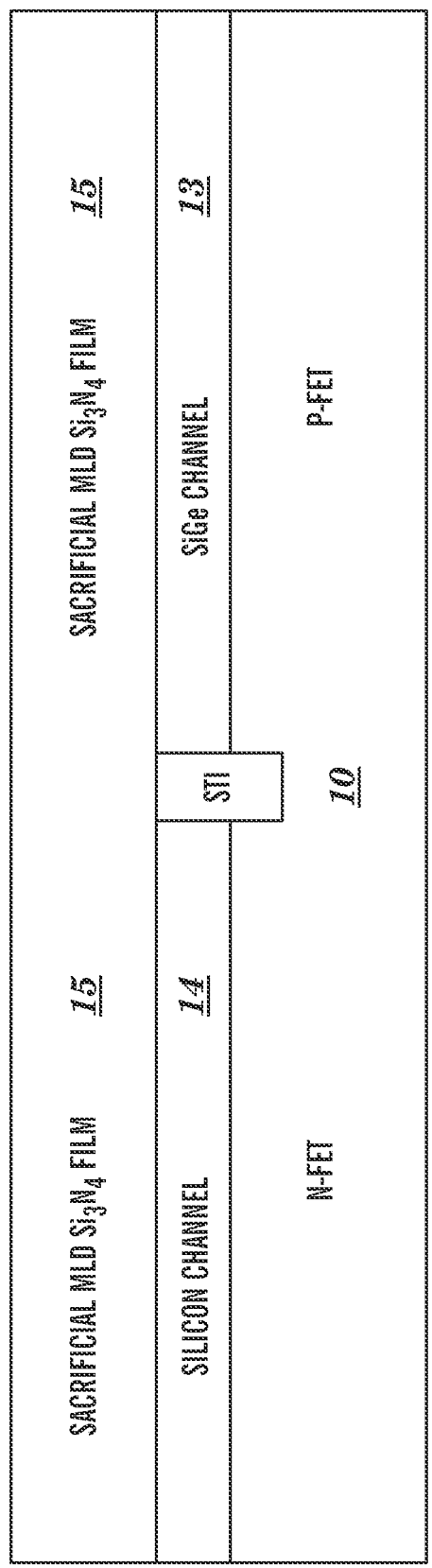
FIG. 2 is a cross-sectional block diagram showing step two of the preferred embodiment.

In FIG. 2, a continuous, sacrificial film 15 is deposited on both the Si and the SiGe channel regions 14, 13 after conventional shallow trench isolation (STI) formation. FIG. 2 shows the deposition of a thin molecular layer deposited (MLD) silicon nitride film having approximately (±10%) equal and constant thicknesses on both the nFET and pFET channel regions 14, 13. Preferably, the film 15 is conformal with the regions 14, 13. Typical thicknesses of the film 15 range from about 10 angstroms to about 50 angstroms. The MLD silicon nitride film 15 is "sacrificial" in the sense that the film 15 will be converted into a high quality $SiO_2$ having excellent reliability and interfacial qualities. This Si3N4 film 15 is deposited, for example, using the following tool model "iRAD" commercially available from Tokyo Electron Limited (TEL).

The embodiment disclosed herein uses MLD Si3N4 but can be performed well with other sacrificial materials which can be deposited sufficiently thin and continuous, and which can be converted to $SiO_2$ via known thermal or plasma techniques. Such sacrificial materials include, for example, amorphous silicon, polycrystalline silicon, or silicon carbide. Such other sacrificial materials can be deposited using tools such as tool model "SinGen" commercially available from Applied Materials, Inc. (AMAT). Also, the thermal or plasma techniques can be performed using tools such as tool model "Radiance" or "DPN" commercially available from Applied Materials, Inc. (AMAT). Those skilled in the art can readily effect the deposition, thermal and/or plasma techniques in view of the present specification and drawing figures.

Figure 3:
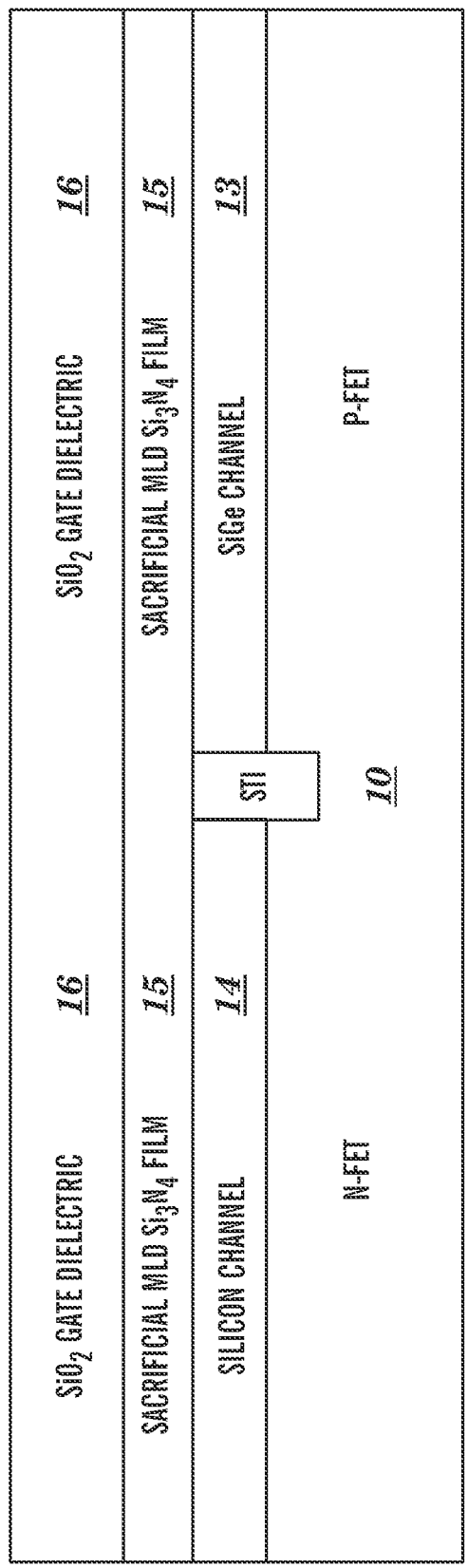
FIG. 3 is a cross-sectional block diagram showing step three of the preferred embodiment.

FIG. 3 shows the beginning of the conversion of the sacrificial film 15 from Si3N4 into a $SiO_2$ layer 16. In FIG. 3, the sacrificial material 15 is oxidized in an appropriate environment. Dry oxidation, wet oxidation, or radical oxidation (FIG. 7) may be used to consume the sacrificial material 15. Oxidation/conversion in this embodiment is by means of radical oxidation (and can be accomplished using conventional plasma based tooling or in other conventional rapid thermal tooling which generates O* in sufficient quantities). The conversion takes place in a top down fashion with [O] replacing [N] in the dielectric film 15. Radical Oxidation can be realized in the appropriate tool according to the characterization diagram shown in FIG. 7. Realizing Radical Oxidation according to the present invention would be well understood by those skilled in the art in view of the present specification and drawing figures.

Figure 4:
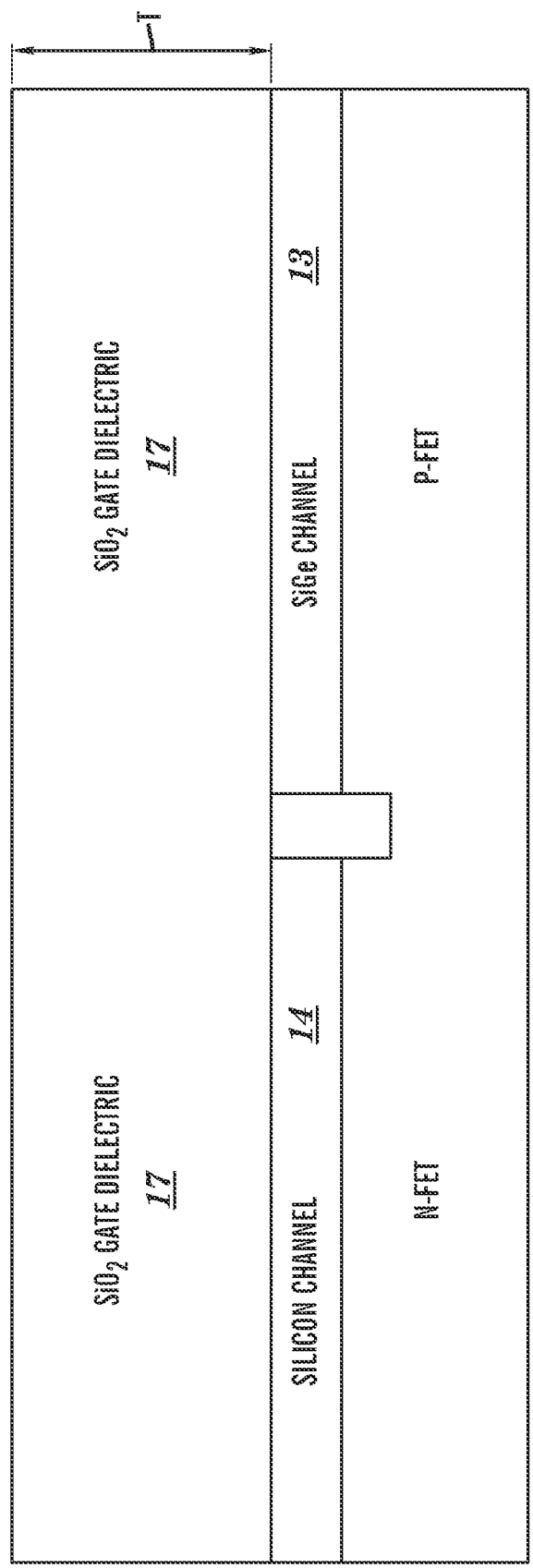
FIG. 4 is a cross-sectional block diagram showing step four of the preferred embodiment.

In FIG. 4, there is shown a cross section of the final gate oxide layer 17. The sacrificial material can be essentially or even completely converted to $SiO_2$. The thickness T of the oxide layer 17 is approximately 2.4 times the thickness of the sacrificial layer 15, in the preferred embodiment. During the converting step according to the preferred embodiment, oxidizing occurs no more than ten (10) angstroms into the SiGe channel material 13 (i.e. in the direction of the Thickness T) and into the Si channel material 14. Even more preferably, none of the SiGe channel material is oxidized. FIG. 4 shows the completed $SiO_2$ gate dielectric. Because the $SiO_2$ film is generated via the thermal oxidation of the pre-existing sacrificial film 15, the final dielectric layer 17 is of a much higher quality relative to the HTO materials. Advantages of $SiO_2$ films generated in this manner (relative to conventional HTO+DPN+PNA) are 1) better reliability, 2) higher quality $SiO_2$/channel interfaces (lower Dit levels), and 3) a reduction in the total number of process steps needed to construct the gate dielectric (e.g. elimination of the DPN/PNA post treatment).

DPN is Decoupled Plasma Nitridation.

PNA is Post Nitridation Anneal.

DPN and PNA steps are well known in the semiconductor manufacturing process art.

Figure 5:
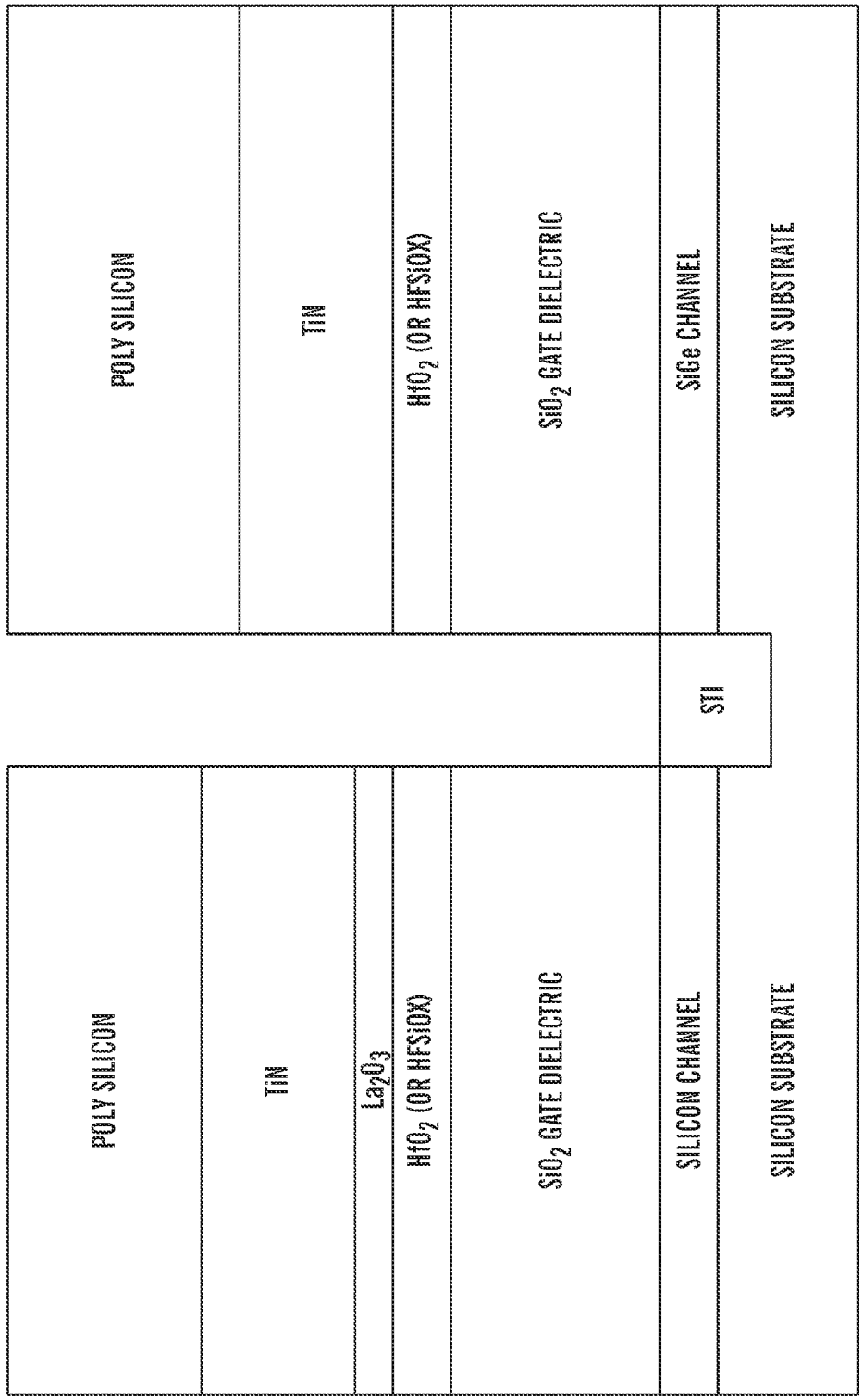
FIG. 5 is a cross-sectional block diagram showing final gate structures after performing additional steps according to an additional preferred embodiment of the invention.

In FIG. 5, final gate stack structures each showing the converted $SiO_2$ dielectric capped with high-k/metal gate stack and polysilicon are illustrated. The illustration is just after conventional "post gate etch," i.e. PC etch, and before conventional spacer, source/drain, and silicide formation. The gate materials ($HFO_2$ or HfSiOX, LaZ03, TiN, Polysilicon) for the N-FET and the gate materials (HfOZ or HfSiOX, TiN, Polysilicon for the P-FET) are deposited using conventional deposition techniques.

Figure 6:
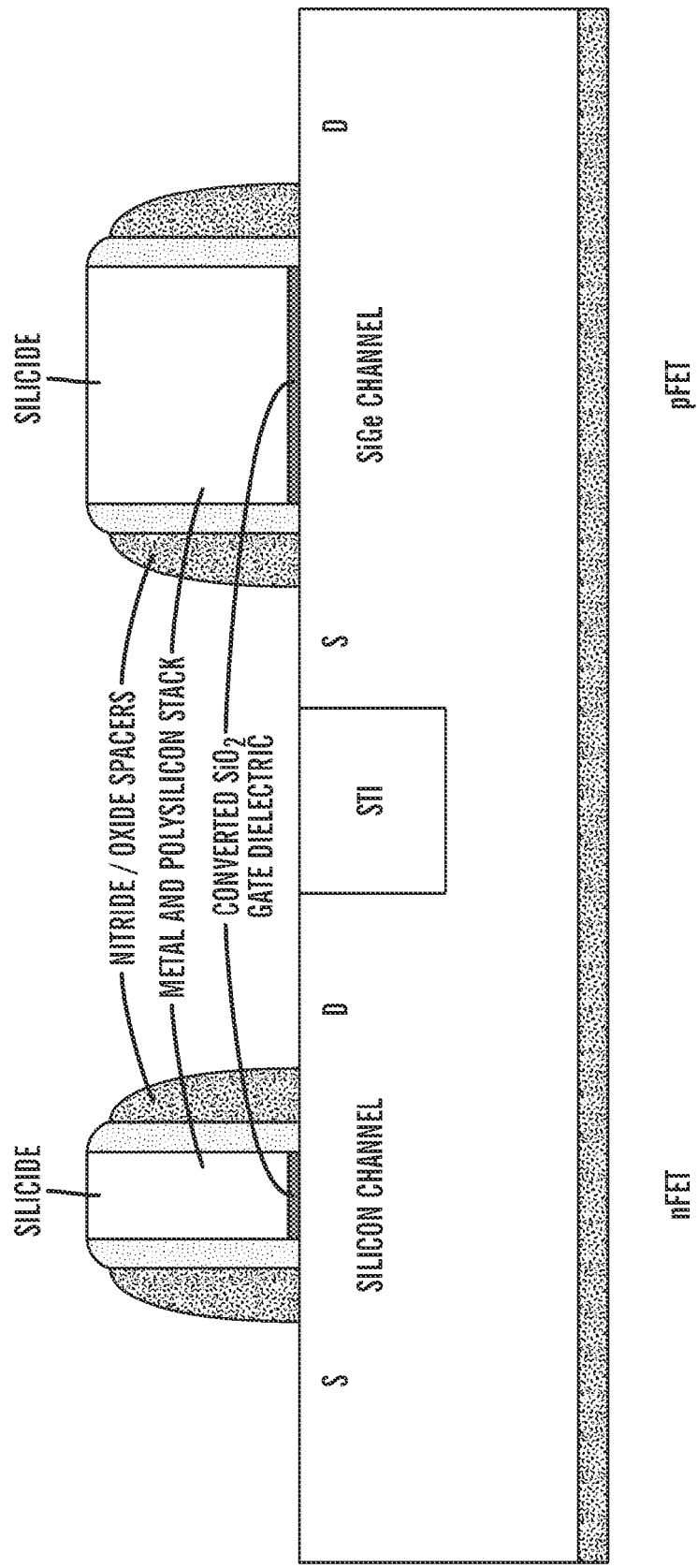
FIG. 6 is a cross-sectional block diagram showing a completed nFET and a completed pFET after performing additional steps (spacer formation, source and drain implants, silicide formation) on the embodiment shown in FIG. 5.

FIG. 6 shows a completed nFET and a completed pFET according to a further preferred embodiment of the invention with the gate stacks known in FIG. 5, and conventional spacers, source/drain regions and silicide caps.

For discussions of various conventional/known techniques for creating a nFET and a pFET on a same substrate, see for example:

U.S. Pat. No. 7,057,216B2 incorporated by reference in its entirety herein;

U.S. Pat. No. 5,547,894 incorporated by reference in its entirety herein;

Fundamentals of Semiconductor Processing Technologies, by Badih El-Korch (Kluwer Academic Publishers, 1997), and VLSI Technology, by S. M. SZE (McGraw Hill, 1988, ISBN 0-07-062 735-5).

Figure 7:
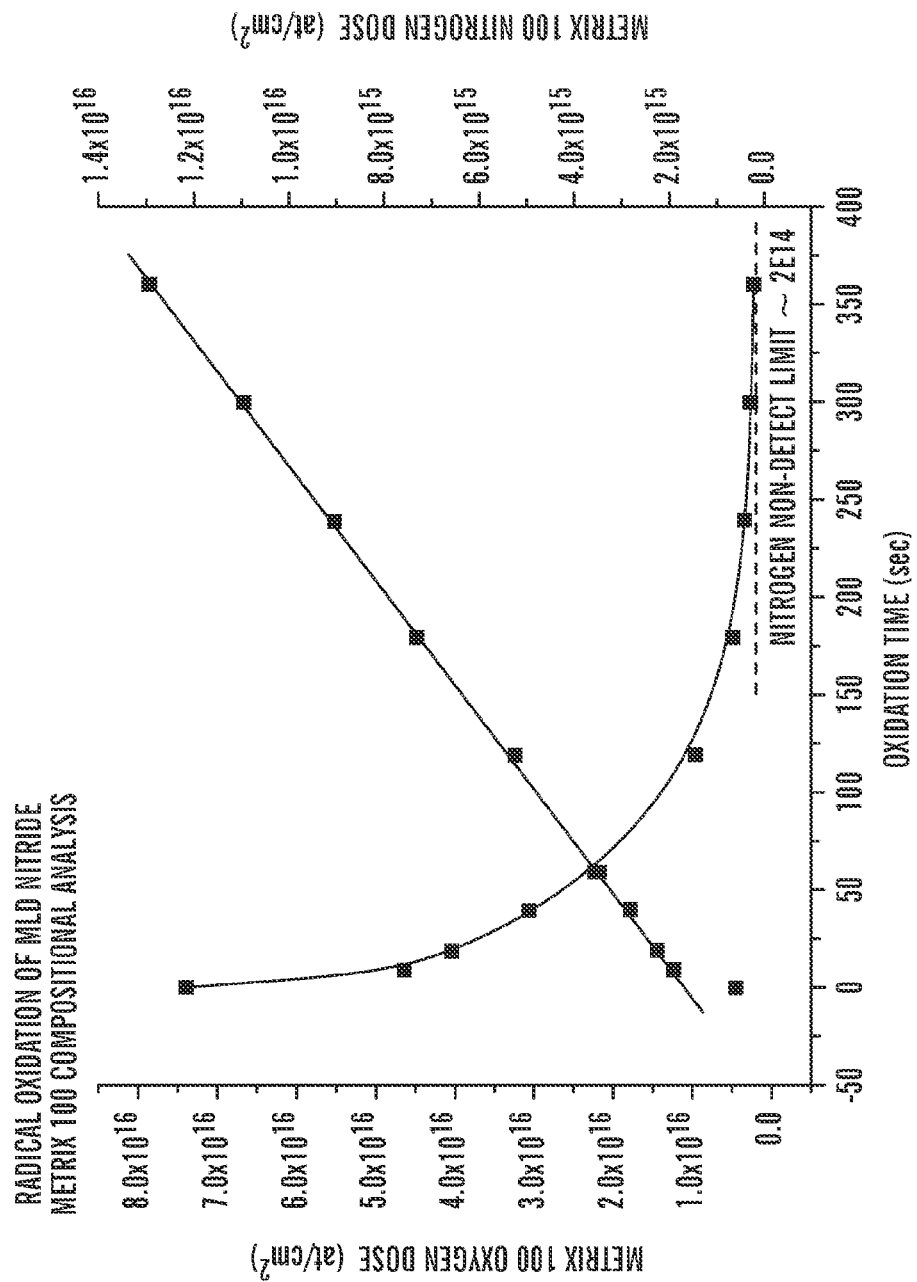
FIG. 7 is a diagram showing characterization of the conversion of MLD Si3N4 to Si02 via radical oxygen.

Finally, FIG. 7 (left plot) shows low energy e-beam microprobe data used to characterize the [N] and [O] content of a sacrificial MLD film as a function of radical oxidation time. The data was used to illustrate the excellent process control of the conversion process and to develop a simple empirical model which can be used by those skilled in the art to design deposited $SiO_2$ gate dielectrics with different final thicknesses.

Example Tools and Parameters for the preferred embodiment of the present invention in a 32 nm Technology Mode include, for example:

MLD Si3N4 deposition is performed at 500 C. Silicon Nitride films are deposited by exposing wafers to alternating flows of dichlorosilane (DCS) and ammonia plus RF power. Typical conditions are 1 slm of DCS and 5 slm of NH3 with 100 W of RF power. The thickness of the layer 15 is determined by controlling, e.g., the number of cycles (i.e. number of thin films deposited).

Radical oxidation (Applied Materials, Inc. tool trade name "ISSG") is performed at 900 C., at pressure of 7 T, and with a H2 concentration of 5% (500 sccm H2 in 9.5 slm O2). The thickness T of the layer 17 is determined by controlling temperature, H2 concentration and/or process time. All these controls would be well understood by those skilled in the art, in view of the present specification and drawing figures.

While the invention has been described in terms of embodiments, those skilled in the art will recognize that the invention can be practiced with modifications and in the spirit and scope of the appended claims. For example, the invention can be readily applicable to SOI or other substrates.

What is claimed is:

1. A method of creating insulating layers on different semiconductor materials, comprising:

providing a substrate having a first semiconductor region and a second semiconductor region, wherein said first semiconductor region comprises a first semiconductor material of a first crystal orientation having a first uppermost surface, and said second region comprises said first semiconductor material having a second uppermost surface which is located adjacent to and beneath said first uppermost surface;

epitaxially growing a second semiconductor material on said second uppermost surface, wherein said second semiconductor material has said first crystal orientation and a chemical composition different from said first semiconductor material;

forming a trench isolation region between sidewall edges of the first semiconductor material and the second semiconductor material, said trench isolation region having a depth extending into a portion of the substrate;

non-epitaxially depositing a continuous sacrificial layer of approximately constant thickness onto the first semiconductor material, the second semiconductor material and an upper surface of the trench isolation region; and converting the sacrificial layer into a layer consisting essentially of $SiO_2$ without oxidizing more than 10 angstroms into the second semiconductor material, wherein said converting the sacrificial layer into a layer consisting essentially of $SiO_2$ comprises radical oxidation at a temperature of about 900° C.

2. The method as claimed in claim 1, wherein the first semiconductor material is silicon and the second semiconductor material is silicon germanium.

3. The method as claimed in claim 1, wherein the non-epitaxially depositing comprises depositing the continuous sacrificial layer using molecular layer deposition.

4. The method as claimed in claim 1, wherein the continuous sacrificial layer has an approximately constant thickness in a range from approximately 10 angstroms to approximately 50 angstroms.

5. The method as claimed in claim 1, wherein the continuous sacrificial layer comprises silicon nitride.

6. The method as claimed in claim 1, wherein the continuous sacrificial layer comprises amorphous silicon.

7. The method as claimed in claim 1, wherein the continuous sacrificial layer comprises polycrystalline silicon.

8. The method as claimed in claim 1, wherein the continuous sacrificial layer comprises silicon carbide.

9. The method as claimed in claim 1, wherein the converting includes converting the sacrificial layer entirely into an $SiO_2$ layer.

10. A method of creating insulating layers on different semiconductor materials, comprising:

providing a substrate comprising a first semiconductor material and having a first crystal orientation, said first semiconductor material consisting essentially of Si;

recessing a portion of said substrate providing a structure comprising a first semiconductor region of said first semiconductor material having an uppermost surface and a second semiconductor region of said first semiconductor material comprising a second uppermost surface, said second uppermost surface is located adjacent to and beneath said first uppermost surface;

epitaxially growing a second semiconductor material having a different chemical composition than said first semiconductor material from said second uppermost surface, said second semiconductor material having said first crystal orientation;

forming a trench isolation region between sidewall edges of the first semiconductor material and the second semiconductor material, said trench isolation region having a depth extending into a portion of the substrate;

molecular layer depositing a continuous silicon nitride layer of approximately constant thickness conformally onto the first semiconductor material, the second semiconductor material and an upper surface of the trench isolation region; and converting the silicon nitride layer into a layer consisting essentially of $SiO_2$ without oxidizing more than 10 angstroms into the second semiconductor material, wherein said converting the silicon nitride layer into a layer consisting essentially of $SiO_2$ comprises radical oxidation at a temperature of about 900° C.

11. The method as claimed in claim 10, wherein the approximately constant thickness is in a range from approximately 10 angstroms to approximately 50 angstroms.

12. The method as claimed in claim 10, wherein the second semiconductor material consists essentially of SiGe.

13. The method as claimed in claim 10, wherein the silicon nitride layer is entirely converted into $SiO_2$ without oxidizing any of the second semiconductor material.

14. The method as claimed in claim 13, wherein the second material layer consists essentially of SiGe.

15. The method as claimed in claim 1, wherein said converting the silicon nitride layer into a layer consisting essentially of $SiO_2$ comprises a pressure of 7 T and with a hydrogen concentration of 5%.

16. The method as claimed in claim 10, wherein said converting the silicon nitride layer into a layer consisting essentially of $SiO_2$ comprises a pressure of 7 T and with a hydrogen concentration of 5%.

17. A method of creating insulating layers on different semiconductor materials, comprising:

providing a substrate having a first semiconductor region and a second semiconductor region, wherein said first semiconductor region comprises a first semiconductor material of a first crystal orientation having a first uppermost surface, and said second region comprises said first semiconductor material having a second uppermost surface which is located adjacent to and beneath said first uppermost surface;

epitaxially growing a second semiconductor material on said second uppermost surface, wherein said second semiconductor material has said first crystal orientation and a chemical composition different from said first semiconductor material;

forming a trench isolation region between sidewall edges of the first semiconductor material and the second semiconductor material, said trench isolation region having a depth extending into a portion of the substrate;

non-epitaxially depositing a continuous sacrificial layer of approximately constant thickness onto the first semiconductor material, the second semiconductor material and an upper surface of the trench isolation region; and converting the sacrificial layer into a layer consisting essentially of $SiO_2$ without oxidizing more than 10 angstroms into the second semiconductor material, wherein said converting the sacrificial layer into a layer consisting essentially of $SiO_2$ comprises wet oxidation.

* * * * *